(12) United States Patent
Bilstein et al.

(10) Patent No.: US 11,346,881 B1
(45) Date of Patent: May 31, 2022

(54) STATUS CHECK FOR A SWITCH

(71) Applicant: Infineon Technologies AG, Neubiberg (DE)

(72) Inventors: Denis Bilstein, Althegnenberg (DE); Michael Asam, Inchenhofen-Sainbach (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 17/183,084

(22) Filed: Feb. 23, 2021

(51) Int. Cl.
| | |
|---|---|
| *G01R 31/00* | (2006.01) |
| *G01R 31/26* | (2020.01) |
| *G01R 19/165* | (2006.01) |
| *G01R 31/327* | (2006.01) |
| *G01R 31/319* | (2006.01) |
| *G01R 31/28* | (2006.01) |
| *G01R 31/30* | (2006.01) |
| *G01R 35/00* | (2006.01) |

(52) U.S. Cl.
CPC ... *G01R 31/2642* (2013.01); *G01R 19/16538* (2013.01); *G01R 31/2834* (2013.01); *G01R 31/2839* (2013.01); *G01R 31/3004* (2013.01); *G01R 31/31922* (2013.01); *G01R 31/31924* (2013.01); *G01R 31/3277* (2013.01); *G01R 31/2851* (2013.01); *G01R 31/2889* (2013.01); *G01R 35/00* (2013.01)

(58) Field of Classification Search
CPC .......... G01R 31/2642; G01R 19/16538; G01R 31/3277; G01R 31/31924; G01R 31/2834; G01R 31/31922; G01R 31/2839; G01R 31/3004; G01R 31/2851; G01R 31/2889; G01R 35/00
USPC ......... 324/71, 378, 403, 415, 425, 500, 537, 324/750.01
See application file for complete search history.

(56) References Cited

U.S. PATENT DOCUMENTS

| | | | |
|---|---|---|---|
| 10,782,334 B2 | 9/2020 | Asam | |
| 2016/0036349 A1* | 2/2016 | Steiner | H05B 47/10 315/307 |
| 2017/0231055 A1* | 8/2017 | Yadav | H05B 45/50 |
| 2019/0006953 A1* | 1/2019 | Steiner | H02M 7/217 |

* cited by examiner

*Primary Examiner* — Raul J Rios Russo
(74) *Attorney, Agent, or Firm* — Shumaker & Sieffert, P.A.

(57) ABSTRACT

In some examples, a device includes a control circuit configured to deliver driving signals to a switch. The device also includes a testing circuit configured to cause the control circuit to toggle the switch at a first instance and determine a parameter magnitude at the switch at a second instance after toggling the switch at the first instance by at least determining a voltage magnitude at the switch at the second instance. The testing circuit is also configured to cause the control circuit to toggle the switch after the second instance and determine a parameter magnitude at the switch at a third instance after toggling the switch after the second instance. The testing circuit is further configured to generate an output based on the determined parameter magnitudes at the switch at the second and third instances.

23 Claims, 13 Drawing Sheets

STATUS CHECK FOR A SWITCH

TECHNICAL FIELD

This disclosure relates to circuitry for power supplies.

BACKGROUND

A power switch manages the flow of electricity from a power supply to a load. Electrical power flows from the power supply to the load when the power switch is activated by a controller. The controller can deliver a control signal to a driver, and the driver can amplify the control signal and deliver the amplified signal to the power switch.

SUMMARY

This disclosure describes techniques for performing a status check on a switch and evaluating the results of the status check. The status check can be performed by a testing circuit of a driver device that is configured to deliver driving signals to a control terminal of the switch to activate and deactivate the switch. The measurements taken during a status check can be evaluated by the testing circuit or by an external controller to determine whether a fault exists on the switch or somewhere else in the system.

The techniques of this disclosure may allow for an autonomous status check that can be performed more quickly than a status check in which each step is commanded by an external controller. A shorter time duration for the status check may be desirable because some industry standards require power interruptions to be relatively brief.

In some examples, a device includes a control circuit configured to deliver driving signals to a switch. The device also includes a testing circuit configured to cause the control circuit to toggle the switch at a first instance and determine a parameter magnitude at the switch at a second instance after toggling the switch at the first instance by at least determining a voltage magnitude at the switch at the second instance. The testing circuit is also configured to cause the control circuit to toggle the switch after the second instance and determine a parameter magnitude at the switch at a third instance after toggling the switch after the second instance. The testing circuit is further configured to generate an output based on the determined parameter magnitudes at the switch at the second and third instances.

In some examples, a method includes delivering driving signals to a switch, toggling the switch at a first instance, and determining a parameter magnitude at the switch at a second instance after toggling the switch at the first instance by at least determining a voltage magnitude at the switch at the second instance. The method also includes toggling the switch after the second instance and determining a parameter magnitude at the switch at a third instance after toggling the switch after the second instance. The method further includes generating an output based on the determined parameter magnitudes at the switch at the second and third instances.

In some examples, a system includes a switch configured to deliver power from a power source to a load, a microcontroller configured to generate control signals for the switch, and a driver device configured to generate driving signals based on the control signals received from the microcontroller and deliver driving signals to the switch. The device includes a testing circuit configured to toggle the switch at a first instance, determine a parameter magnitude at the switch at a second instance after toggling the switch at the first instance by at least determining a voltage magnitude at the switch at the second instance, and toggle the switch after the second instance. The testing circuit is also configured to determine a parameter magnitude at the switch at a third instance after toggling the switch after the second instance and transmit, to the microcontroller, data indicating the parameter magnitudes at the switch at the second and third instances. The microcontroller is configured to determine whether a fault has occurred in the system based on the parameter magnitudes at the switch at the second and third instances.

The details of one or more examples are set forth in the accompanying drawings and the description below. Other features, objects, and advantages will be apparent from the description and drawings, and from the claims.

DETAILED DESCRIPTION

This disclosure describes devices, methods, and techniques for testing a switch. To confirm that the switch is able to activate and deactivate, a driver device may be configured to perform a status check. The status check involves measuring parameter magnitudes (e.g., voltage or current) at the switch, where the parameter magnitudes can be evaluated to diagnose a potential fault on the switch or elsewhere in the system. In some examples, the driver device is configured to perform the status check quickly and autonomously to minimize the interruption to the normal operation of the system.

Figure 1:
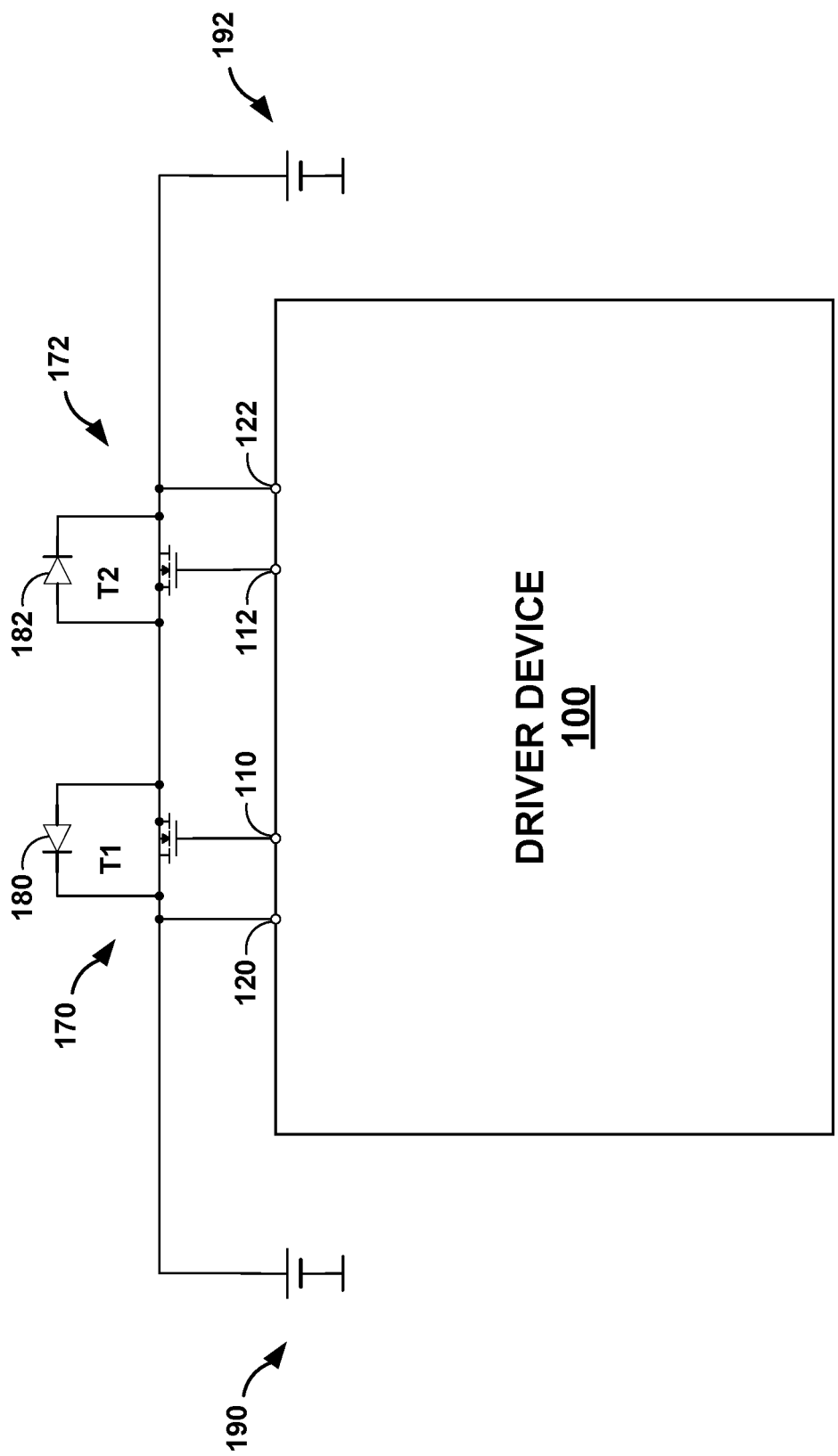
FIGS. 1 and 2 are conceptual block diagrams of driver devices configured to test a switch, in accordance with the techniques of this disclosure.
Figure 2:
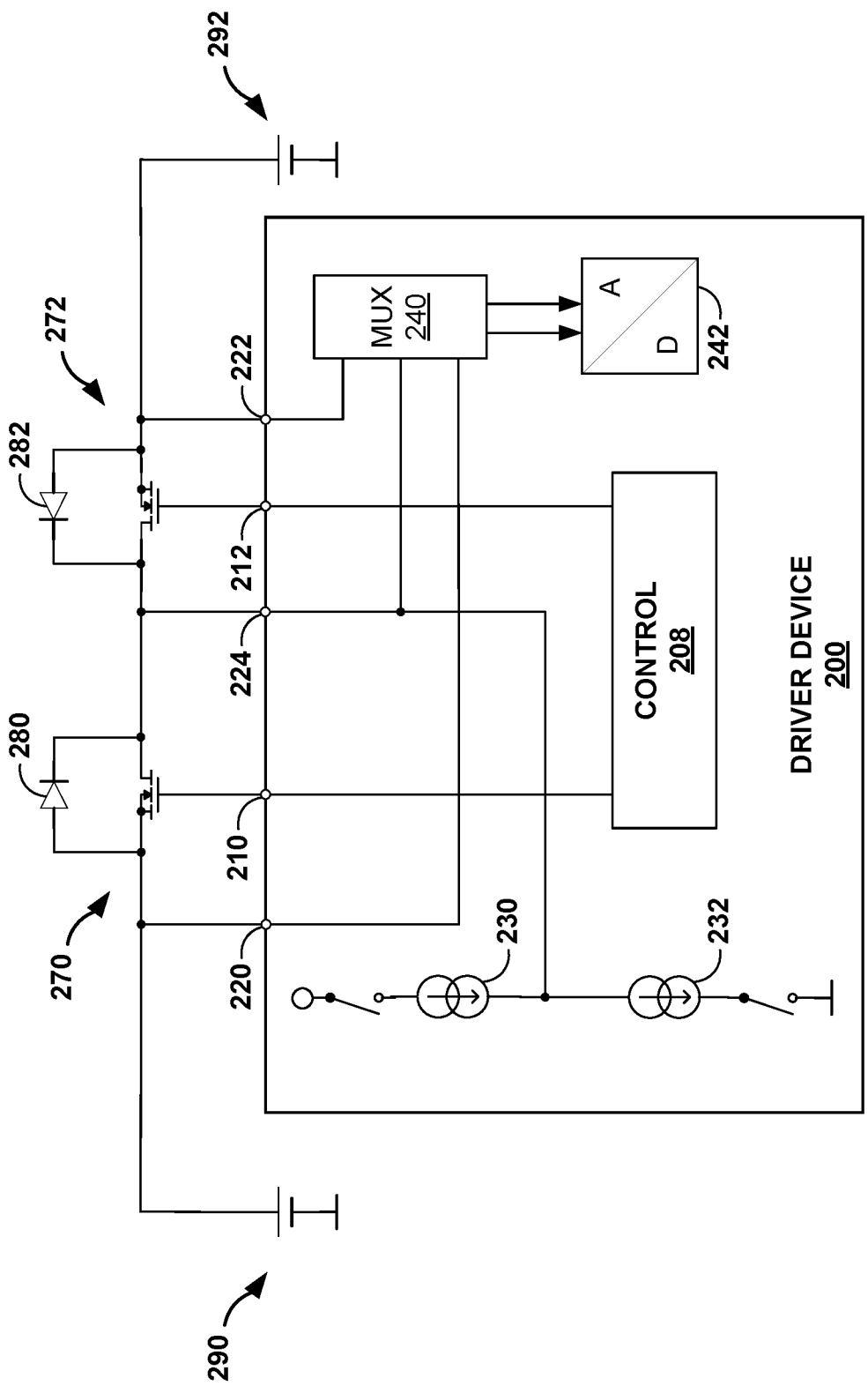

FIGS. 1 and 2 are conceptual block diagrams of driver devices 100 and 200 configured to test switches 170, 172, 270, and 272, in accordance with the techniques of this disclosure. Driver device 100 may be configured to activate and deactivate switches 170 and 172 by delivering driving signals to switches 170 and 172 via output nodes 110 and 112. Driver device 100 may receive commands from a microcontroller, where the commands instruct driver device 100 how and when to activate and deactivate switches 170 and 172 during normal operation (e.g., when a status check is not being performed).

In the example shown in FIG. 1, driver device 100 may be configured to operate switches 170 and 172 in a normally activated state or in a normally deactivated state. In some examples, however, driver device 100 may control switches 170 and 172 via a modulation control signal, such as pulse width modulation (PWM), pulse frequency modulation (PFM), pulse duration modulation, pulse density modulation, or another type of modulation control signal. Modulation control signals can be applied to the control terminal of a power switch so as to control on/off switching of switch 170 or 172, and thereby control the average amount of power delivered through switch 170 or 172 to a load. The on/off switching of switch 170 or 172 effectively chops its power delivery up into discrete parts. The average value of voltage and/or current fed to a load can be controlled by activating and deactivating switch 170 or 172 at a fast rate. The longer switch 170 or 172 is activated compared to the deactivated periods, the higher the total power supplied to the load.

Driver device 100 may be used in an automotive system for providing power to a load such as a braking system, a power-steering system, or another automotive subsystem. Driver device 100 may be configured to run a status check on switch 170 or 172 at least once per drive cycle to confirm that switch 170 or 172 is still functioning properly. For example, driver device 100 may perform a status check to confirm that switch 170 can be activated and deactivated (e.g., closed and opened). Driver device 100 may be configured to confirm that a normally activated switch can be deactivated and that a normally deactivated switch can be activated. In examples in which a load experiences a short circuit and/or an overcurrent, driver device 100 should be able to deactivate switch 170 to disconnect power supply 190 from the load.

Driver device 100 includes output nodes 110 and 112 and input nodes 120 and 122. Driver device 100 may be configured to control the operation of switches 170 and 172 by delivering driving signals to the control terminals (e.g., gates or bases) of switches 170 and 172 via output nodes 110 and 112. For example, driver device 100 can activate switch 170 by outputting a driving signal from output node 110 to the control terminal of switch 170.

Input nodes 120 and 122 are coupled to the channel terminals of switches 170 and 172. For example, input node 120 may be coupled to the drain terminal of switch 170, where switch 170 includes a metal-oxide-semiconductor field-effect transistor (MOSFET), or input node 120 may be coupled to the emitter terminal of switch 170, where switch 170 includes an insulated-gate bipolar transistor (IGBT). Driver device 100 may be configured to receive a sensed signal via input node 170, where the sensed signal indicates a parameter magnitude at switch 170.

Switches 170 and 172 may be connected in an arrangement such as series, anti-series, parallel, or anti-parallel. As shown in FIG. 1, switches 170 and 172 are connected back-to-back in a common-source arrangement, but switches 170 and 172 may be connected in a series configuration, an anti-series configuration, and/or a parallel configuration. Switches 170 and 172 may include, but are not limited to, any type of field-effect transistor (FET) such as a diffusion MOSFET, a bipolar junction transistor (BJT), an IGBT, a high-electron-mobility transistor (HEMT), and/ or another element that uses voltage and/or current for its control. Switches 170 and 172 may include n-type transistors and/or p-type transistors. Switches 170 and 172 may include semiconductor material such as silicon, silicon carbide, and/or gallium nitride. In some examples, each of switches 170 and 172 may include a plurality of transistors connected in parallel.

Diode 180 is connected in parallel with switch 170, and diode 182 is connected in parallel with switch 172. Diode 180 may be oriented in a direction that is opposite of the orientation of diode 182. Diodes 180 and 182 may be discrete components or may be part of switches 170 and 172 (e.g., the internal body diodes of a MOSFET switch). Thus, when both of switches 170 and 172 are deactivated, current cannot flow through both of diodes 180 and 182. In examples in which current flows through diode 180 while switch 170 is deactivated, a voltage across switch 170 may be equal to the voltage drop across diode 180 (e.g., 0.7 volts).

The system shown in FIG. 1 consolidates two different power supplies 190 and 192. Although not shown in FIG. 1, the system may also include one or more loads, which may be connected to the node between switches 170 and 172, to the node between switch 170 and power supply 190, and/or to the node between switch 172 and power supply 192. In examples in which a load is connected to the node between switches 170 and 172, either of power supplies 190 and 192 can provide power to the load. In examples in which a load is connected to a node between power supply 190 and switch 170, driver device 100 can isolate the fault from the load in response to detecting a fault at power supply 192.

Driver device 100 may be capable of testing switches 170 and 172 to confirm whether switches 170 and 172, power supplies 190 and 192, and/or a load are properly connected. In addition, driver device 100 may be configured to perform a status check to confirm that driver device 100 can deactivate switches 170 and/or 172 in case of a failure such as an overcurrent event.

Driver device 100 and one or both of switches 170 and 172 can be used as a fuse replacement or as a board net replacement. As part of a fuse replacement, driver device 100 may be configured to check that switches 170 and 172 are in the desired state (e.g., activated or deactivated) and whether it is possible for driver device 100 to put switch 170 or 172 in a different state. Regardless of the application, the safety and operation of switches 170 and 172 may depend the ability of driver device 100 to activate and deactivate switches 170 and 172.

In accordance with the techniques of this disclosure, driver device 100 may be configured to run a status check to detect an open circuit, to detect a short circuit, or to confirm that switch 170 or 172 can be operated properly. By having driver device 100 perform the status check, no additional circuitry external to driver device 100 is needed.

Driver device 100 may be configured to run a fast autonomous sequence for activating and deactivating switch 170 or 172 while performing measurements before, during, and after the status check. Moreover, the status check time and the evaluation time can be separated in time. Driver device 100 or a microcontroller may be configured to independently evaluate the measurement results at any later time to determine if the switching process was successful.

FIG. 2 shows some of the circuitry internal to driver device 200. As shown in the example of FIG. 2, driver device 200 includes testing circuit such as current sources 230 and 232, multiplexer 240, and analog-to-digital converter (ADC) 242.

Driver device 200 also includes control circuit 208 configured to control the operation of switches 270 and 272 by delivering driving signals to the control terminals of switches 270 and 272 via output nodes 210 and 212, respectively. The testing circuit of driver device 200 may be configured to perform status checks on both of switches 270 and 272 according to the techniques of this disclosure. The testing circuit may be configured to perform these status checks non-concurrently a first status check on switch 270 and perform a second status check on switch 272 after completing the first status check.

Input node 220 is coupled to a channel terminal of switch 270, and input node 222 is coupled to a channel terminal of switch 272. Input node 224 is coupled to a channel terminal of switch 270 and a channel terminal of switch 272. For example, input node 224 may be coupled to the drain terminal of switch 270 and the drain terminal of switch 272, where switches 270 and 272 include MOSFETs.

Current sources 230 and/or 232 may be configured to generate a current across input node 224. Current sources 230 and/or 232 can be used to detect a short circuit or open circuit across switches 270 and 272, whether switches 270 and 272 are connected in series or anti-series. In an anti-series configuration, a drain or collector terminal of switch 270 may be connected to a drain or collector terminal of switch 272, or a source or emitter terminal of switch 270 may be connected to a source terminal or emitter of switch 272.

Anti-series switches are commonly coupled to two or more power supplies 290 and 292 in order to, for example, control power delivery from the two or more power supplies 290 and 292. Moreover, serial switches are often used in settings for interrupting current flow in both directions. For example, serial switches may be used in electric vehicles, self-driving vehicles, or other settings where an electrical short or electrical failure can result in safety concerns.

Multiplexer 240 may be configured to output one or more of the sensed signals received from input nodes 220, 222, and 224 to ADC 242. ADC 242 can generate one or more digital numbers that represent the analog signals received from multiplexer 240. Each digital number outputted by ADC 242 represents a magnitude of a parameter sensed at one or more of input nodes 220, 222, and 224.

Figure 10:
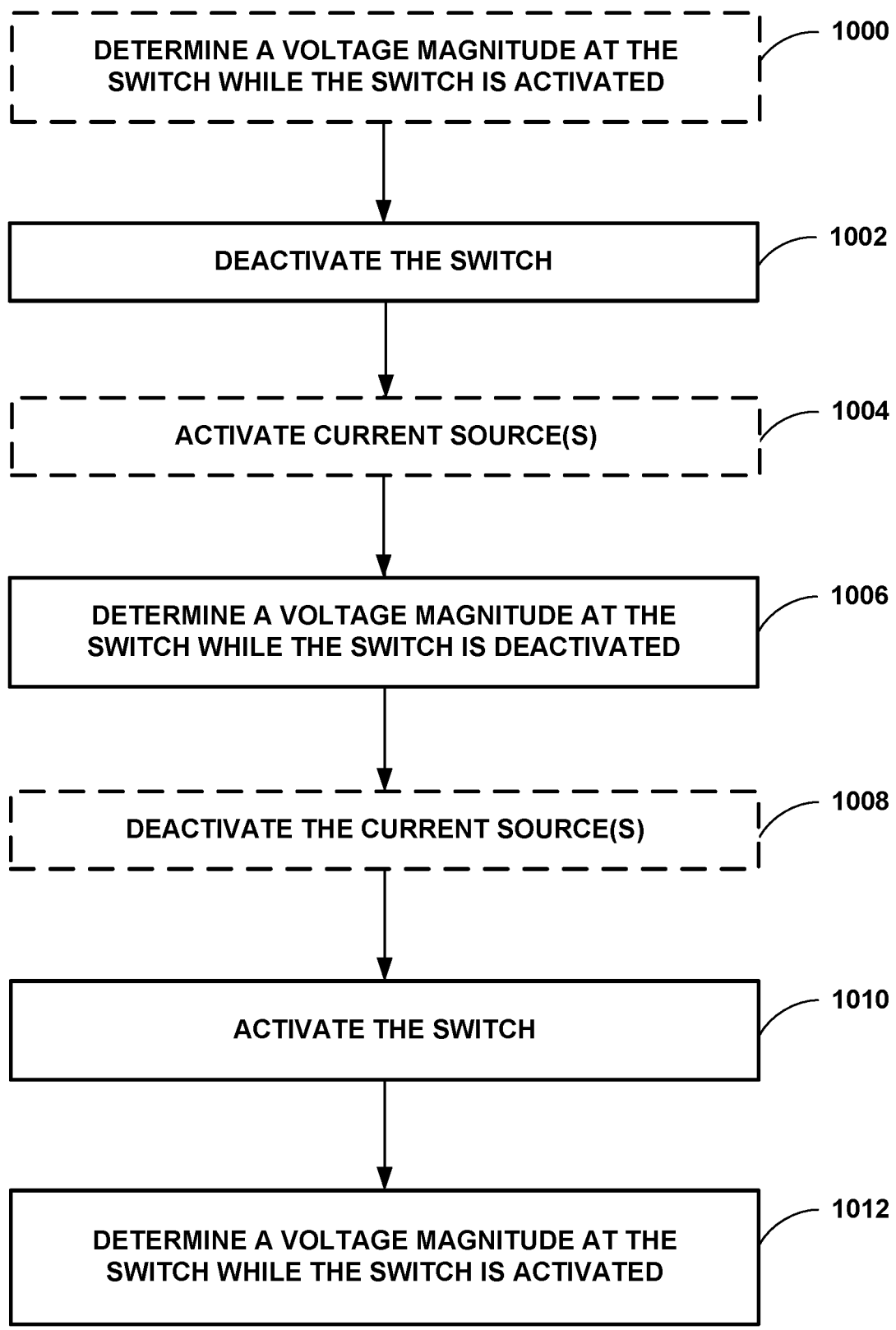
Figure 11:
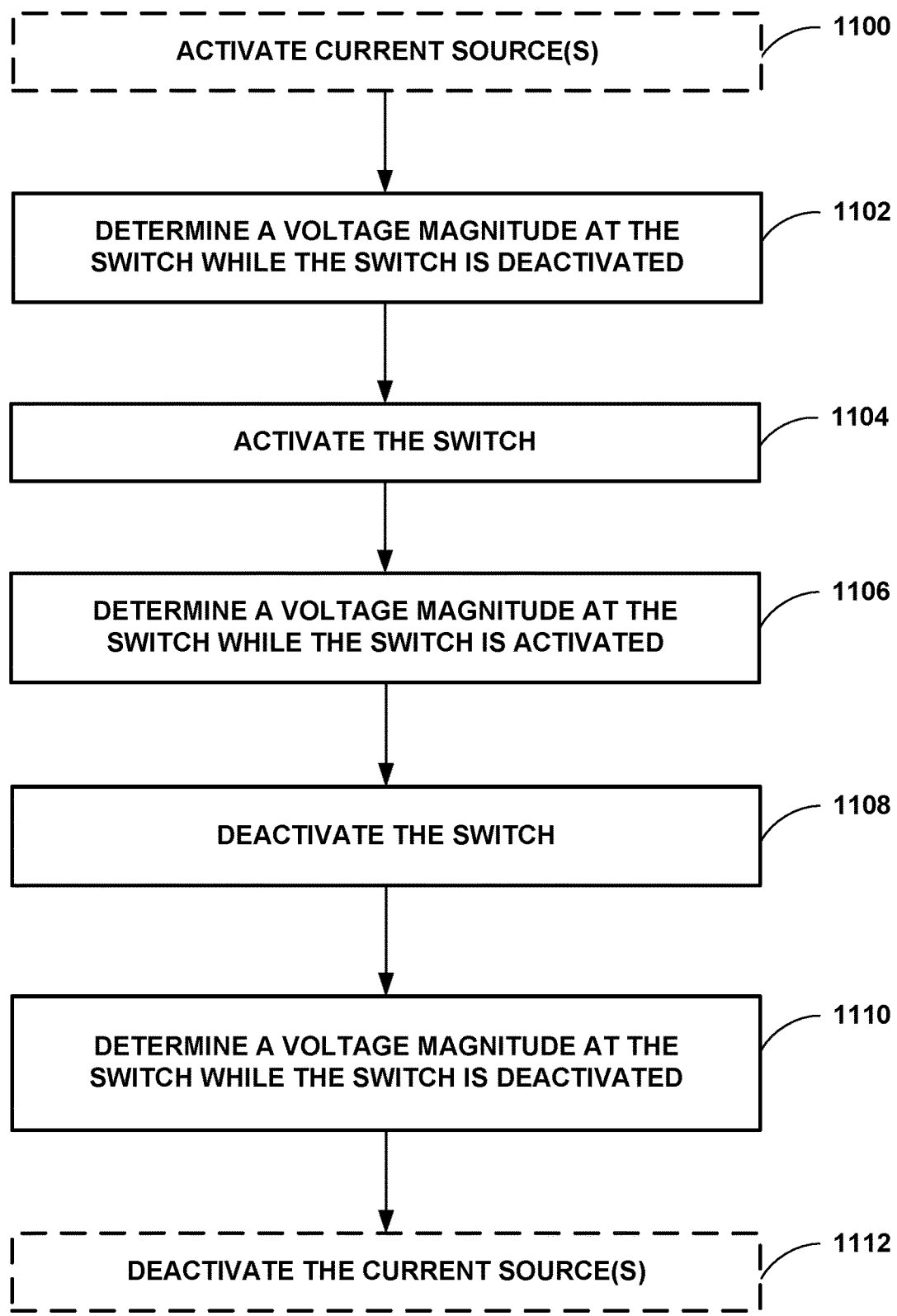

Driver device 200 may include additional testing circuitry not shown in FIG. 2 configured to determine parameter magnitudes based on the digital numbers outputted by ADC 242. The testing circuit may be configured to activate one or both of current sources 230 and 232 before measuring a parameter magnitude via input nodes 220, 222, and/or 224. The testing circuit may be configured to then deactivate current sources 230 and 232 after measuring the parameter magnitude. In some examples, the testing circuit may be configured to activate one or both of current sources 230 and 232 for two or more measurements of a status check. FIGS. 10 and 11 depict techniques that include activating and deactivating current sources 230 and 232 during a status check, where the activation of current sources 230 and 232 is an optional step in the status check.

Although FIG. 2 depicts multiplexer 240 configured to select and deliver one or more signals to ADC 242, driver device 200 may include two or more ADCs for receiving signals from input nodes 220, 222, and 224 without any multiplexer. For example, driver device 200 may include a first ADC configured to receive signals from input nodes 220 and 224 and a second ADC configured to receive signals from input nodes 222 and 224. In addition to ADC 242 or as an alternative to ADC 242, driver device 200 may include one or more comparators for comparing a sensed signal received from input node 220, 222, and/or 224 to a threshold level.

ADC 242 may be configured to receive a first signal from input node 220 or 224 representing the voltage magnitude at switch 270. ADC 242 may be configured to receive a second signal from input node 222 or 224 representing the voltage magnitude at switch 272. Additionally or alternatively, ADC 242 may be configured to receive a first differential signal representing the voltage magnitude across switch 270 and/or receive a first differential signal representing the voltage magnitude across switch 272.

Figure 3:
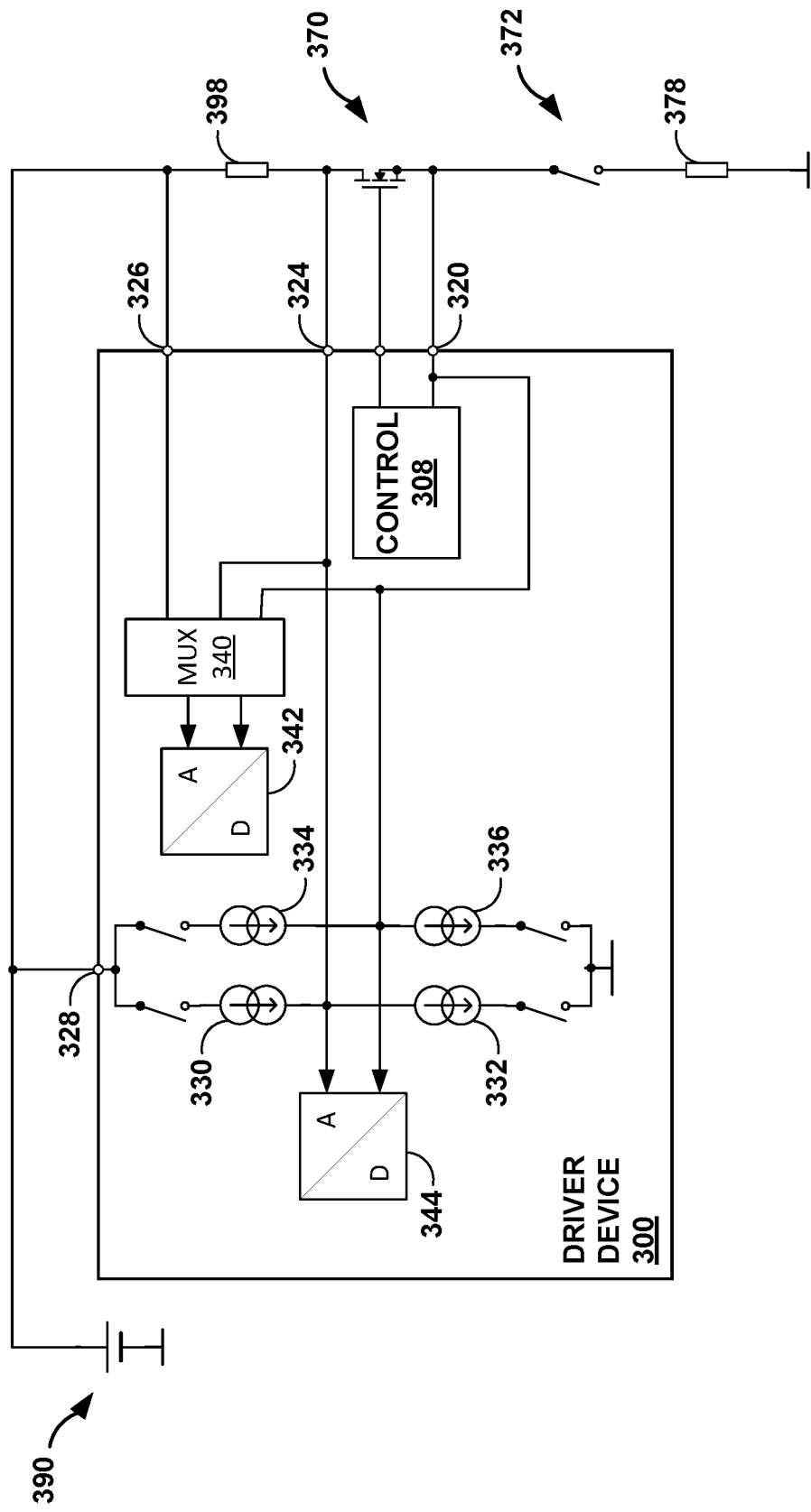
FIG. 3 is a conceptual block diagram of a driver device configured to sense the current and voltage at a switch, in accordance with the techniques of this disclosure.

FIG. 3 is a conceptual block diagram of a driver device 300 configured to sense the current and voltage at a switch 370, in accordance with the techniques of this disclosure. As shown in FIG. 3, driver device 300 includes four current sources 330, 332, 334, and 336 and two ADCs 342 and 344.

Driver device 300 has additional current sources to generate electrical currents across both of input nodes 320 and 324. Current sources 330 and 332 may be configured to generate a first current across input node 324, which can receive a sensed signal indicating a voltage magnitude at a first channel terminal of switch 370. Current sources 334 and 336 may be configured to generate a first current across input node 320, which can receive a sensed signal indicating a voltage magnitude at a second channel terminal of switch 370. Each of current sources 330 and 334 may receive power from power supply 390 via node 328.

Current sources 330, 332, 334, and 336 may be configured to test the open circuit of switch 370 when switch 370 is deactivated. For example, current source 334 can push current to node 320, and current source 332 can pull current from node 324 to check whether an open circuit exists across switch 370. Although not shown in FIG. 3, a diode may be connected across switch 370 to allow current to flow from node 320 to node 324.

Multiplexer 340 is configured to receive sensed signals and deliver one or more of the sensed signals to ADC 342. For example, multiplexer 340 may be configured to receive sensed signals from input nodes 320, 324, and 326. Multiplexer 340 may be configured to deliver one or more of the received signals to ADC 342. The signals sensed at input nodes 320 and 324 may indicate the voltage magnitude at the channel terminals of switch 370 (e.g., the source and drain terminals or the collector and emitter terminals). The signals sensed at input nodes 324 and 326 may indicate the current magnitude through switch 370. As shown in FIG. 3, current measurement element 398 includes a shunt resistor, but other current sensors can be used, such as a current mirror, a Hall sensor, and/or any other current sensor.

In examples in which switch 370 is activated during normal operation, control circuit 308 may be configured to deactivate switch 370 to perform a measurement during a status check and to reactivate switch 370 after performing the measurement. Control circuit 308 may be configured to also deactivate switch 372 to perform a measurement during a status check and to reactivate switch 372 after performing the measurement. Thus, both of switches 370 and 372 may be deactivated during at least one of the measurements performed during a status check.

After deactivating switches 370 and 372, driver device 300 may be configured to determine whether the voltage sensed at input node 320 is floating. To make this determination, a testing circuit can activate current sources 334 and/or 336 to pull the voltage at input node 320 up and down. In response to determining that the voltage at input node 320 is floating, the testing circuit may be configured to determine the voltage magnitude at input node 320.

Figure 4:
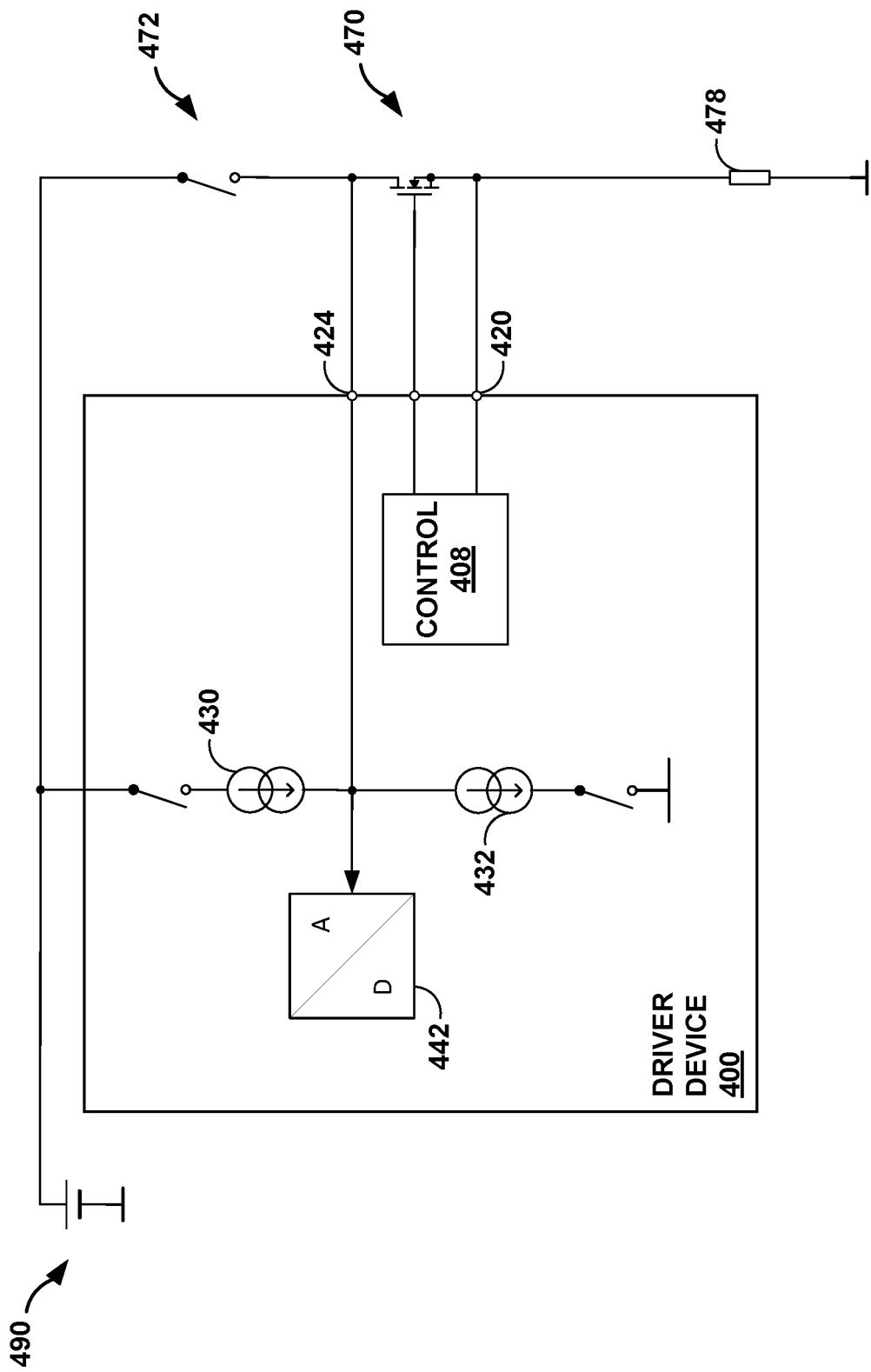
FIG. 4 is a conceptual block diagram of a driver device configured to test a switch coupled in series with a second switch, in accordance with the techniques of this disclosure.

FIG. 4 is a conceptual block diagram of a driver device 400 configured to test a switch 470 coupled in series with a second switch, in accordance with the techniques of this disclosure. When control circuit 408 deactivates switches 470 and 472, node 424 may be disconnect from power supply 490 and load 478. Driver device 400 may be configured to test whether switch 470 is actually deactivated by causing current sources 430 and 432 to push current to or pull current from node 424.

Figure 5:
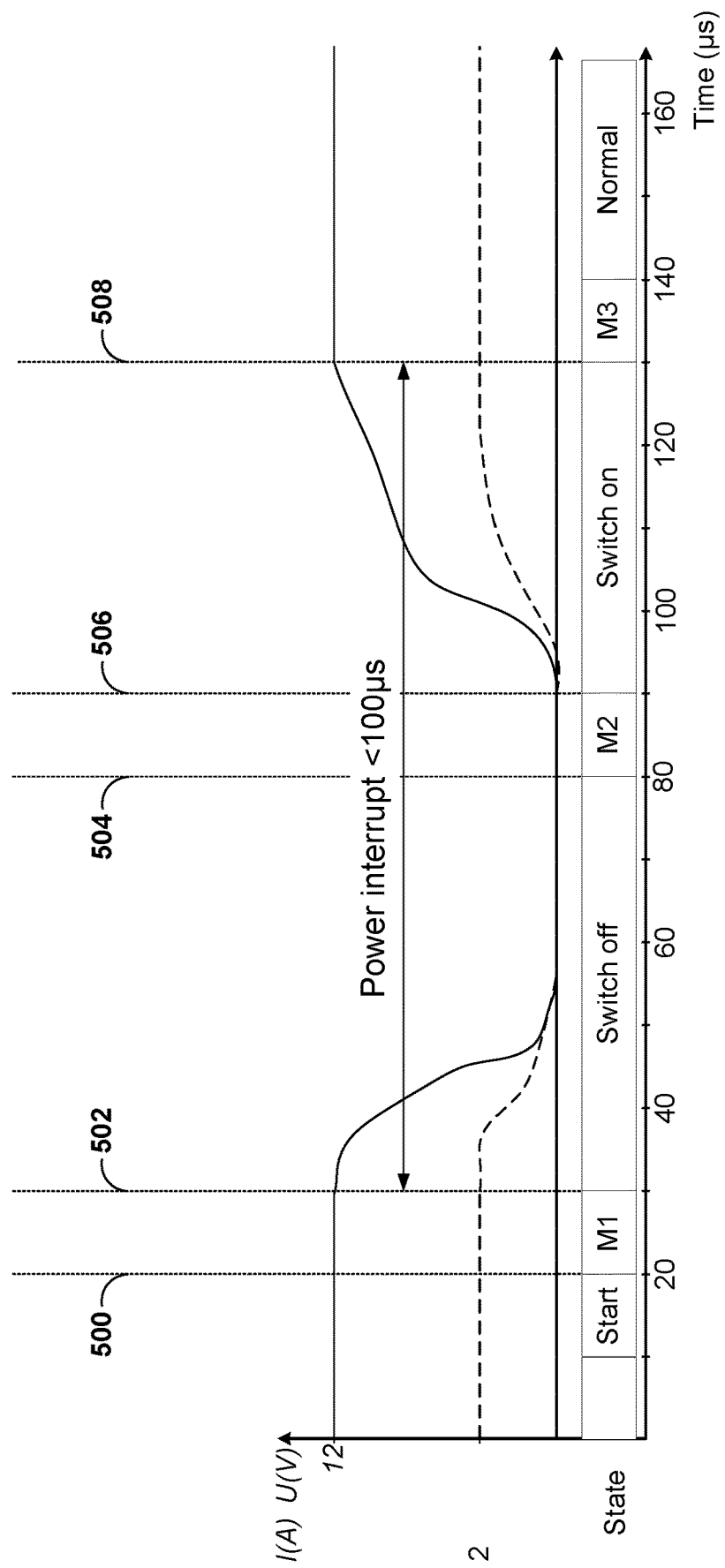
FIG. 5 is a timing diagram of a status check for a switch, in accordance with the techniques of this disclosure.

FIG. 5 is a timing diagram of a status check for a switch, in accordance with the techniques of this disclosure. The switch being tested in FIG. 5 is normally activated, but the switch is deactivated for measurement M2 between times 504 and 506. The techniques shown in FIG. 5 can also be used for a normally deactivated switch, where the switch is activated for measurement M2 and then deactivated before measurement M3.

At time 500, a testing circuit initiates the status check by determining a magnitude of a parameter of the switch. The first measurement is labeled in FIG. 5 as M1, and each measurement shown in the example of FIG. 5 lasts ten microseconds, but other time durations are possible. This first measurement is optional and need not occur in every status check. The first measurement occurs while the switch is activated before the control circuit deactivates the switch at time 502. After performing the first measurement, the testing circuit causes the control circuit to deactivate the switch at time 502. The testing circuit may be configured to deactivate the switch a predetermined time duration after time 500, where the predetermined time duration is based on a schedule stored to memory.

After the switch is deactivated at time 502, the testing circuit performs a second measurement by determining the magnitude of the parameter of the switch at time 504. The testing circuit may be configured to perform the second measurement a predetermined time duration after time 502, where the predetermined time duration is based on a schedule stored to memory. If the switch takes twenty microseconds after time 502 to fully deactivate, time 504 may be programmed as forty or fifty microseconds after time 502.

In the example shown in FIG. 5, the second measurement occurs while the switch is deactivated before the control circuit reactivates the switch at time 506. After performing the second measurement, the testing circuit causes the control circuit to activate the switch at time 506. The testing circuit may be configured to activate the switch a predetermined time duration after time 504, where the predetermined time duration is based on a schedule stored to memory.

After the switch is activated at time 506, the testing circuit performs a third measurement by determining the magnitude of the parameter of the switch at time 508. The testing circuit may be configured to perform the third measurement a predetermined time duration after time 506, where the predetermined time duration is based on a schedule stored to memory. In the example shown in FIG. 5, the third measurement occurs while the switch is activated after the control circuit reactivates the switch at time 506. After performing the third measurement, the testing circuit can analyze the measurement data and/or transmit (e.g., read out) the measurement data to a microcontroller.

FIG. 5 depicts an example status check that begins when the switch is activated and ends with the switch having been reactivated. Another status check may be performed for a switch that is deactivated during normal operation. A status check for a deactivated switch may include first and third measurements that occur while the switch is deactivated and a second measurement that occurs while the switch is activated.

The total time to perform a status check may be less than twenty, forty, sixty, one hundred, or two hundred microseconds. For example, the time span from deactivating the switch at time 502 to the beginning of the third measurement at time 508 may be less than or equal to one microseconds. Industry standards may provide for a maximum power interrupt time span. For example, LV 124 of the German Automotive Manufacturer Testing Standards restricts the maximum power interrupt to one hundred microseconds. A long power interrupt during a status check can cause a high charge current because the different charge levels of power supplies, especially for board net consolidation applications. A driver device may be able to complete a status check within an acceptable time duration by autonomously performing a status check, instead of performing each step of the status check in response to a separate command issued by a microcontroller.

Figure 6:
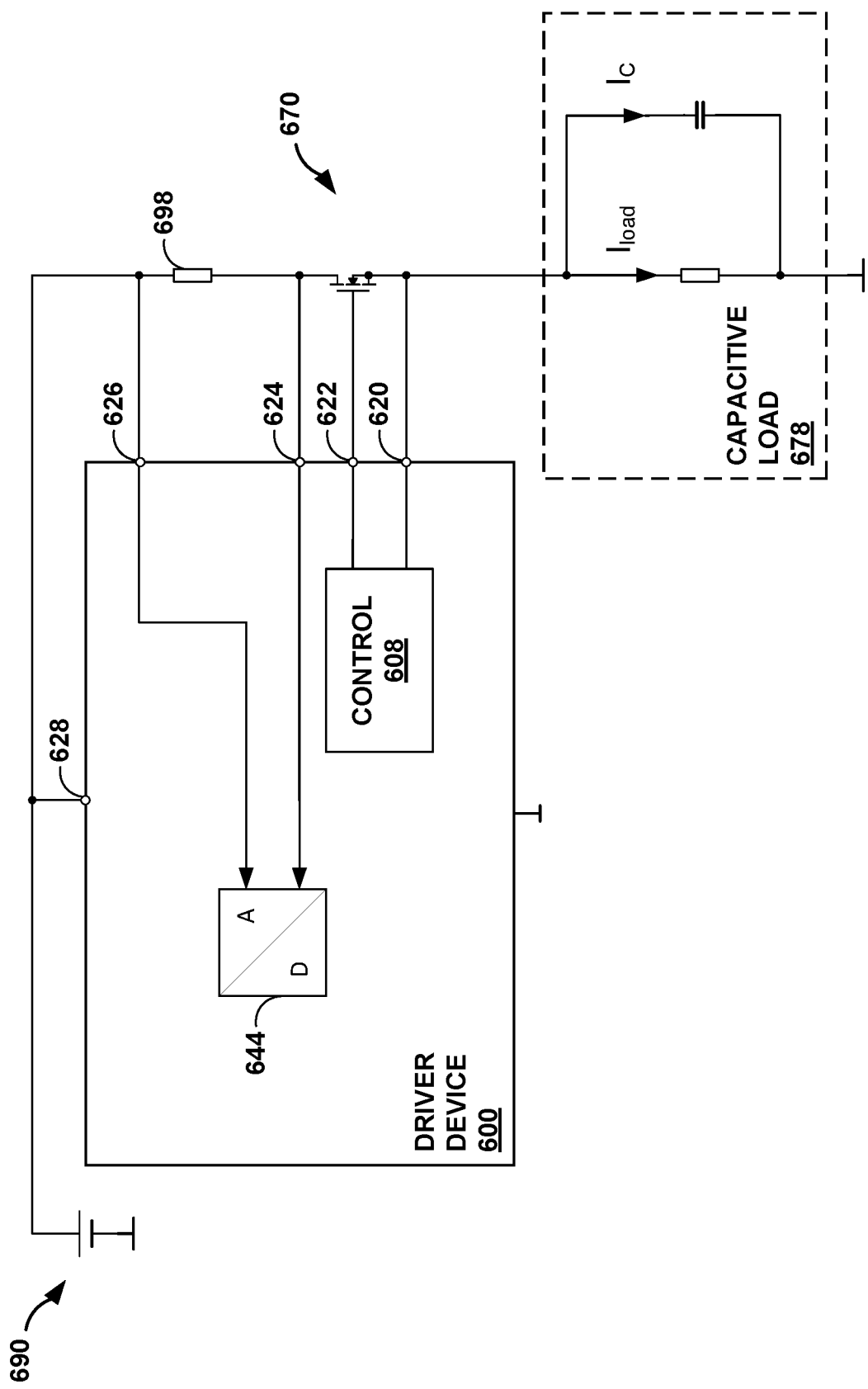
FIG. 6 is a conceptual block diagram of a switch for delivering power to a capacitive load, in accordance with the techniques of this disclosure.

FIG. 6 is a conceptual block diagram of a switch 670 for delivering power to a capacitive load 678, in accordance with the techniques of this disclosure. When switch 670 is deactivated, the voltage across capacitive load 678 may not measurably decline in a short amount of time such as approximately one hundred or two hundred microseconds. As a result, driver device 600 may be configured to measure the current through switch 670 and/or through capacitive load 678. In examples in which capacitive load 678 consumes a very low current, changes in the current may be difficult to detect. Control circuit 608 can deactivate switch 670 to discharge the capacitor of load 678 and subsequently activate switch 670 to generate a current pulse.

When switch 670 is deactivated, the capacitor in load 678 will discharge slowly by a small load current. After driver device 670 reactivates switch 670 to connect power supply 690 and quickly recharge the capacitor in load 678. Driver device 600 can detect the high recharge current, and the current can be used as pass criteria. For example, switch 670 may be deactivated for ten milliseconds with a discharge current of one milliampere. If the current spike that results from reactivating switch 670 lasts for five microseconds, then the re-charge current will be approximately two amperes, as shown in Equation (1).

$$I_{charge} = \frac{\text{Total charge}}{time_{charge}} = I_{discharge}\left(\frac{time_{discharge}}{time_{charge}}\right) = (1 \text{ mA})\left(\frac{10 \text{ ms}}{5 \text{ μs}}\right) = 2 \text{ A} \qquad (1)$$

Driver device 600 may include memory configured to store a voltage drop that will trigger the reactivation of switch 670. In response to determining that the voltage sensed at input node 620 has decreased below the stored threshold voltage, control circuit 608 may be configured to reactivate switch 670. The memory onboard driver device 600 may also store a maximum allowed time span. In response to determining that the voltage has not drop below the threshold voltage within the maximum allowed time span, driver device 600 may be configured to determine that there is a fault on switch 670 or on 678, such as an open circuit across load 678.

The memory may also store a minimum current threshold level for the recharge current after switch 670 is reactivated.

In response to determining that the recharge current does not exceed the minimum current threshold level, driver device 600 may be configured to determine that a fault exists on switch 670 or on load 678. All of these thresholds and values stored to memory onboard driver device 600 may be programmable based on the characteristics of switch 670 and load 678. For example, the discharge level and time may be determined to achieve a desired current pulse. In addition, all of the parameters depend on the capacitor used in capacitive load 678.

Figure 7:
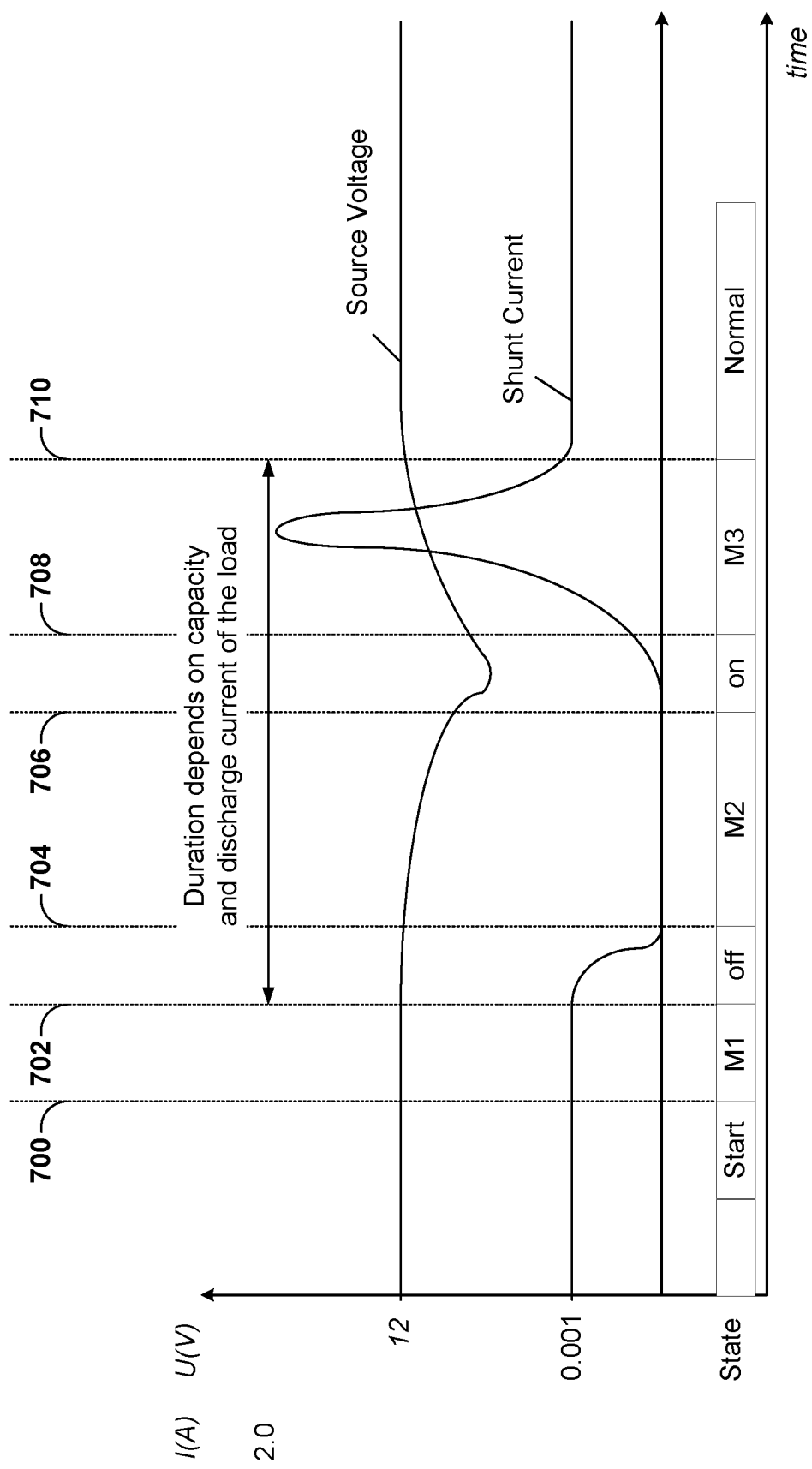
FIG. 7 is a timing diagram of a status check for a switch that delivers power to a capacitive load, in accordance with the techniques of this disclosure.

FIG. 7 is a timing diagram of a status check for a switch that delivers power to a capacitive load, in accordance with the techniques of this disclosure. The switch being tested in FIG. 7 is normally activated but is deactivated for the measurement M2.

At time 700, a testing circuit initiates the status check by determining a magnitude of a parameter of the switch. The first measurement is labeled in FIG. 7 as M1. This first measurement is optional and need not occur in every status check. The first measurement occurs while the switch is activated before the control circuit deactivates the switch at time 702. After performing the first measurement, the testing circuit causes the control circuit to deactivate the switch at time 702. The testing circuit may be configured to deactivate the switch a predetermined time duration after time 700, where the predetermined time duration is based on a schedule stored to memory.

After the switch is deactivated at time 702, the testing circuit performs a second measurement by determining the magnitude of the parameter of the switch at time 704. The testing circuit may be configured to perform the second measurement a predetermined time duration after time 702, where the predetermined time duration is based on a schedule stored to memory. In the example shown in FIG. 7, the second measurement occurs while the switch is deactivated before the control circuit reactivates the switch at time 706.

The testing circuit may be configured to determine a parameter magnitude after time 704 until one of two events occurs: (a) the parameter magnitude drops below a threshold level, or (b) a maximum allowed time span expires. After time, 704, the testing circuit may be configured to repeatedly determine and compare the parameter magnitude with the threshold level. In examples in which the parameter is a voltage at a channel terminal of the switch, the voltage may gradually decrease as the capacitive load discharges after the switch is deactivated at time 704. If the switch or the load is faulty, the voltage may not decrease below the threshold level because the switch may not be fully deactivated or because the load may have an open-circuit fault that prevent the expected discharge. The testing circuit may be configured to start a timer at time 704 and exit or conclude the status check if the timer reaches the maximum allowed time span before the parameter magnitude drops below the threshold level.

In response to determining that the parameter magnitude does not drop below the threshold level within the maximum allowed time span, the testing circuit may be configured to determine that a fault has occurred on the switch or on the load that is coupled to the switch. In response to determining that the parameter magnitude drops below the threshold level within the maximum allowed time span, the testing circuit may be configured to cause the control circuit to activate the switch at time 706.

The testing circuit may be configured to perform a third measurement by determining a parameter magnitude after reactivating the switch at time 706. For example, the testing circuit may be configured to determine the parameter magnitude at one or more instances between times 708 and 710, where the parameter may be a current through the activated switch. The testing circuit may compare the one or more determined magnitudes between times 708 and 710 to a second threshold level. In response to determining that one of the determined magnitude(s) is greater than the second threshold level, the testing circuit may be configured to determine that the switch and/or load have passed the status check. In response to determining that one of the determined magnitude(s) is less than or equal to the second threshold level, the testing circuit may be configured to determine that a fault has occurred on the switch or load.

Figure 8:
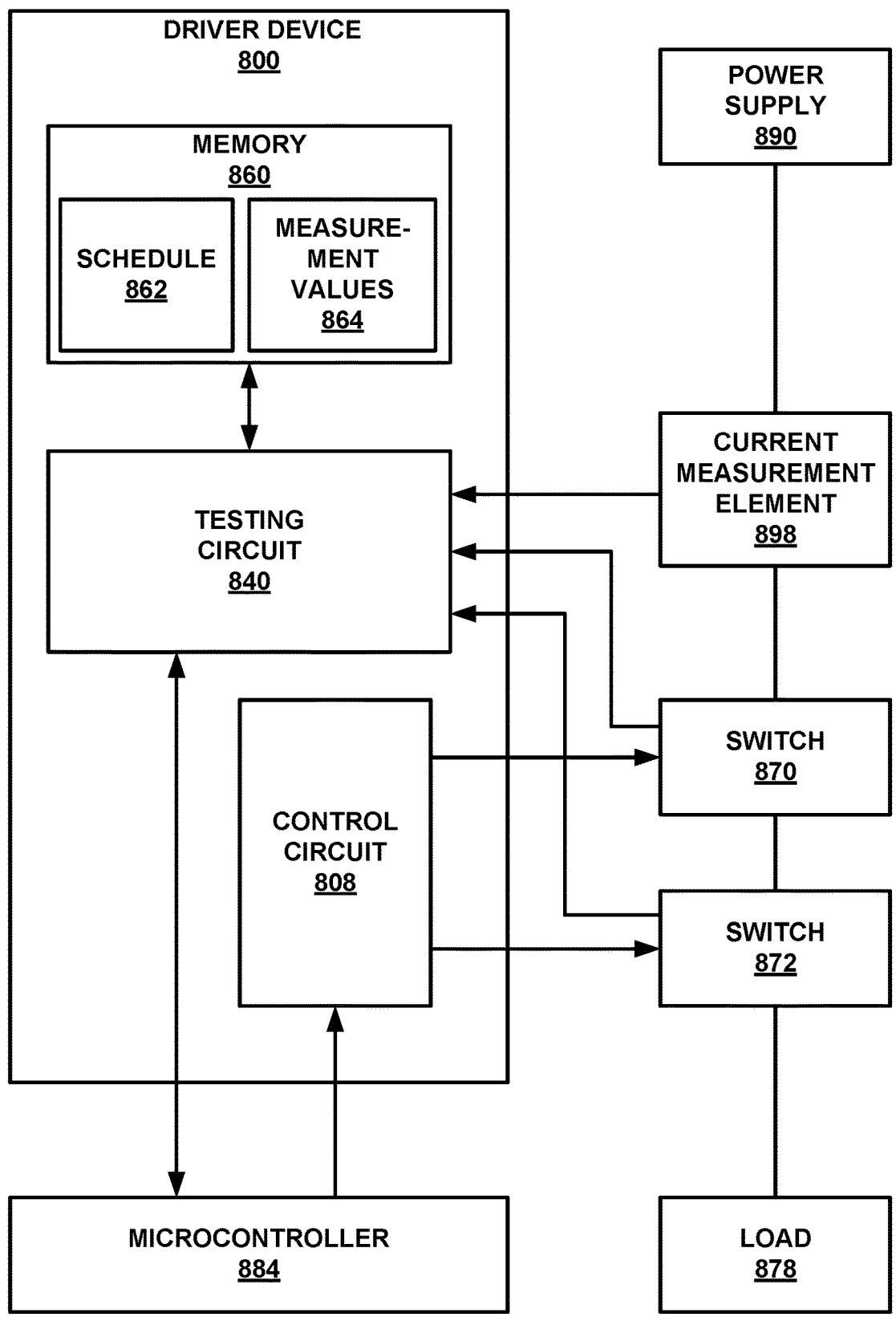
FIG. 8 is a conceptual block diagram of a system including a driver device and two switches, in accordance with the techniques of this disclosure.

FIG. 8 is a conceptual block diagram of a system including a driver device 800 and two switches 870 and 872, in accordance with the techniques of this disclosure. Driver device 800 includes control circuit 808, testing circuit 840, and memory 860. Driver device is coupled to switches 870 and 872, microcontroller 884, and current measurement element 898.

Testing circuit 840 may be configured to perform a status check to detect an open circuit or a short circuit for single switch (e.g., switch 870) or multiple switches (e.g., switches 870 and 872). Testing circuit 840 may be configured to perform a status check for a floating terminal for a single switch, or two switches with a common-terminal connection (e.g., a common-drain connection or a common-source connection).

Memory 860 may be configured to store schedule 862 and measurement values 864. Testing circuit 840 may be configured to initiate a status check based on schedule 862, where the status check may include the techniques shown in any of FIGS. 9-13. Schedule 862 may cause testing circuit 840 to initiate a status check at a regular interval (e.g., once per hour) and/or at startup of driver device 800. Moreover, testing circuit 840 may be configured to initiate a status check in response to detecting a fluctuation of a sensed parameter or another anomalous event.

Measurement values 864 include parameter magnitudes that are determined by testing circuit 840 during a status check. For example, testing circuit 840 may be configured to determine and store two or more parameter magnitudes during each status check. Testing circuit 840 can store the determined parameter magnitudes to memory 860 as measurement values 864. In some examples, testing circuit 840 may be configured to evaluate a determined parameter magnitude immediately after a measurement without storing that parameter magnitude to memory 860.

Testing circuit 840 may be configured to initiate a status check based on schedule 862. Thus, testing circuit 840 can autonomously perform a status check by determining parameter magnitudes at switch 870 or 872 and autonomously causing control circuit 808 to toggle switch 870 or 872 during the status check. In addition, testing circuit 840 may be configured to autonomously generate an output based on the sensed parameter magnitudes. Therefore, testing circuit 840 may be configured to autonomously initiate and perform the status check without any involvement from microcontroller 884.

Additionally or alternatively, testing circuit 840 may be configured to initiate a status check based on a command received from microcontroller 884 via the communication interface between driver device 800 and microcontroller 884. The command may indicate when microcontroller 884 should initiate the status check or how often testing circuit 840 should perform status checks. In some examples, testing circuit 840 may be configured to autonomously perform each step of a status check without separate commands received from microcontroller 884. Thus, microcontroller 884 can trigger the initiation of the status check, and then testing circuit 840 performs the entire status check autonomously.

Schedule 862 may also include the timings of measurements and toggle events after the status check is initiated. Testing circuit 840 can use schedule 862 for a status check that is initiated autonomously or for a status check that is initiated by a command from microcontroller 884. For example, schedule 862 may provide for a first measurement taken when the status check is initiated, a first toggle event ten microseconds after the status check is initiated, a second measurement taken sixty microseconds after the status check is initiated, a second toggle event seventy microseconds after the status check is initiated, and a third measurement taken one hundred and ten microseconds after the status check is initiated. Each toggle event may be an activation or deactivation of switch 870 or 872. A status check that is performed autonomously, whether initiated autonomously or by command from microcontroller 884, may be faster than a status check where every step must be commanded by a microcontroller.

Driver device 800 may be configured to evaluate measurement values 864 inside driver device 800 and/or to transmit measurement values 864 to microcontroller 884 for evaluation outside of driver device 800. Driver device 800 can transmit measurement values 864 immediately after testing circuit 840 senses these values. For example, driver device 800 may transmit a measurement value sensed during a status check before the end of the status check. Additionally or alternatively, driver device 800 can transmit measurement values 864 after the end of the status check. Driver device 800 may be configured to transmit all of measurement values 864 in a single batch, or driver device 800 may be configured to separately transmit each of measurement values 864.

Current measurement element 898 may include any circuit element or sensor that is capable of outputting or generating a signal indicating the current through switch 870. For example, current measurement element 898 may include a shunt resistor (e.g., current measurement element 398 or 698 shown in FIGS. 3 and 6). Additionally or alternatively, current measurement element 898 may include a Hall sensor, a current mirror, a magnetoresistive sensor, and/or another current sensing element.

Figure 9:
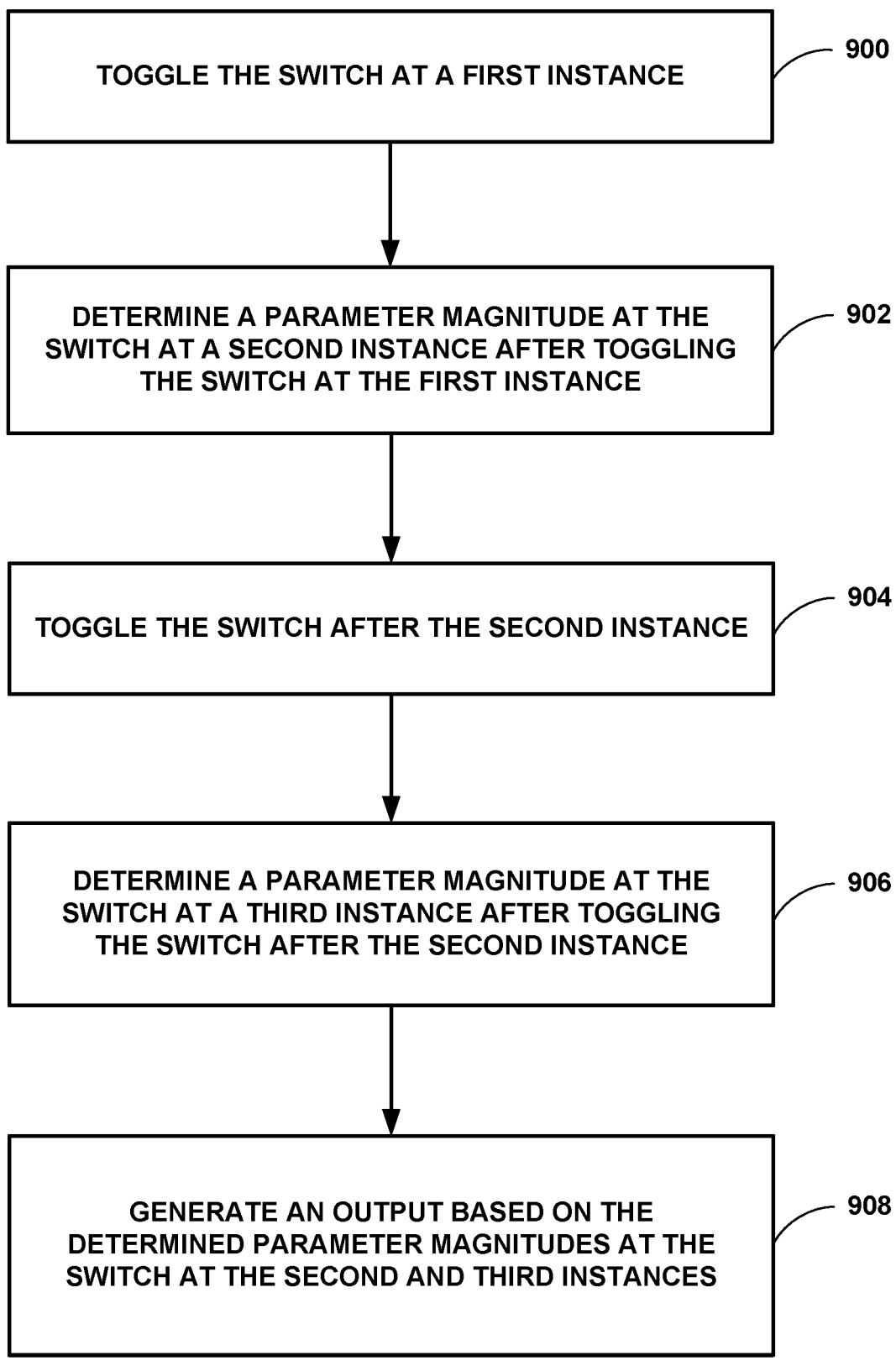
FIGS. 9-11 are flow diagrams illustrating example techniques for testing a switch, in accordance with the techniques of this disclosure.

FIGS. 9-11 are flow diagrams illustrating example techniques for testing a switch, in accordance with the techniques of this disclosure. Any of the testing techniques shown in FIGS. 9-11 can be performed during the drive cycle of a driver device. The techniques of FIGS. 9-11 are described with reference to driver device 300 shown in FIG. 3, but the techniques of FIGS. 9-11 may be performed by any of driver devices 100, 200, 400, 600, and 800 shown in FIGS. 1, 2, 4, 6, and 8.

In the example of FIG. 9, control circuit 308 toggles switch 370 at a first instance (900). For a normally activated switch, control circuit 308 can deactivate switch 370 at the first instance. For a normally deactivated switch, control circuit 308 can activate switch 370 at the first instance. The testing circuit of driver device 300 then determines a parameter magnitude at switch 370 at a second instance after toggling switch 370 at the first instance (902). The parameter magnitude may be a voltage or a current a node 320 and/or 324, such as a voltage at either of the channel terminals of switch 370, a voltage drop across switch 370, or a current through switch 370.

Control circuit 304 then toggles switch 370 after the second instance (904), and the testing circuit determines a parameter magnitude at switch 370 at a third instance after toggling switch 370 after the second instance (906). The testing circuit generates an output based on the determined parameter magnitudes at switch 370 at the second and third instances (908). The output may include a transmission of the determined parameter magnitudes to a microcontroller. The output may include an indication of whether a fault has occurred on switch 370, switch 372, or load 378. Driver device 300 can transmit the indication of a fault or lack thereof to the microcontroller.

In the example of FIG. 10, the testing circuit takes a first, optional measurement by determining a voltage magnitude at switch 370 while switch 370 is activated (1000). Control circuit 308 then deactivates switch 370 after the first measurement (1002). Driver device 300 can also deactivate switch 372 at approximately the same time as deactivating switch 370. Deactivating both of switches 370 and 372 causes the voltage at input node 320 to be floating. Driver device 300 optionally activates one or more of current sources 330, 332, 334, and 336 (1004) and determines a voltage magnitude at switch 370 while switch 370 is deactivated (1006). Driver device 300 may be configured to use one or more of current sources 334 and 336 to check whether node 320 is floating.

Driver device 300 then deactivates current sources 330, 332, 334, and 336 (1008), and control circuit 308 reactivates switch 370 (1010). The testing circuit takes a measurement by determining a voltage magnitude at switch 370 while switch 370 is activated (1012). Using the determined voltage magnitudes, driver device 300 or a microcontroller can determine whether a fault exists on switch 370, switch 372, or load 378.

In the example of FIG. 11, driver device 300 optionally activates one or more of current sources 330, 332, 334, and 336 (1100). The testing circuit takes a first measurement by determining a voltage magnitude at switch 370 while switch 370 is deactivated (1102). Control circuit 308 then activates switch 370 after the first measurement (1104). Driver device 300 can also activate switch 372 at approximately the same time as activating switch 370. The testing circuit determines a voltage magnitude at switch 370 while switch 370 is activated (1106).

Control circuit 308 then deactivates switch 370 (1108), and the testing circuit takes a measurement by determining a voltage magnitude at switch 370 while switch 370 is deactivated (1110). The testing circuit then deactivates current sources 330, 332, 334, and 336 (1112). Using the determined voltage magnitudes, driver device 300 or a microcontroller can determine whether a fault exists on switch 370, switch 372, or load 378.

Figure 12:
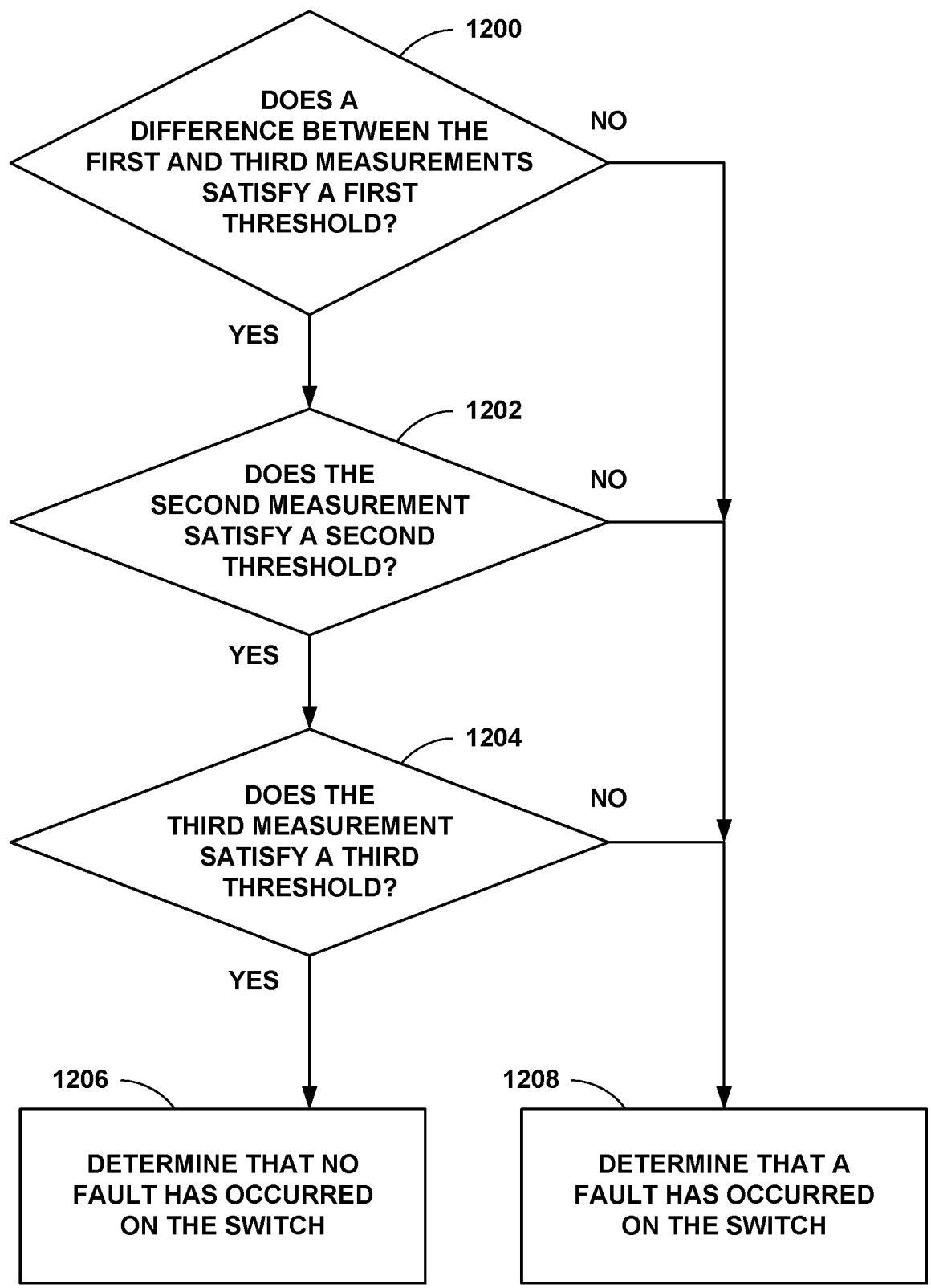
FIG. 12 is a flow diagram illustrating example techniques for evaluating measurements taken at a switch, in accordance with the techniques of this disclosure.

FIG. 12 is a flow diagram illustrating example techniques for evaluating measurements taken at a switch, in accordance with the techniques of this disclosure. The techniques of FIG. 12 are described with reference to driver device 800 shown in FIG. 8, but the techniques of FIG. 12 may be performed by any of driver devices 100, 200, 300, 400, and 600 shown in FIGS. 1, 2, 4, and 6.

The evaluation techniques in FIG. 12 can be performed can be performed by a driver device or a microcontroller. In addition, the evaluation techniques in FIG. 12 can be performed independently from the status check techniques shown in FIGS. 9-11. For example, a driver device can perform a status check, store the measurements, and evaluate the measurements at a later time. Additionally or alternatively, the driver device can perform the status check, store the measurements, and transmit the measurement data to a microcontroller for evaluation at a later time.

In the example of FIG. 12, testing circuit 840 determines whether a difference between the first and third measurements satisfies a first threshold (1200). Testing circuit 840 may be configured to determine that the difference satisfies the first threshold by determining that the first and third measurements are sufficiently close (e.g., approximately equal). In other words, testing circuit 840 may be configured to determine that an absolute value of the difference is less than a particular level in order to determine that the different satisfies the first threshold. The determination in step 1200 is optional because in some examples, a status check does not include the first measurement.

Testing circuit 840 then determines whether the second measurement satisfies a second threshold (1202). In examples in which switch 870 is deactivated during the second measurement, testing circuit 840 may be configured to determine that the parameter magnitude at switch 870 is less than or equal to the second threshold level. In examples in which switch 870 is activated during the second measurement, testing circuit 840 may be configured to determine that the parameter magnitude at switch 870 is greater than or equal to the second threshold level or that the parameter magnitude is within an acceptable range.

Testing circuit 840 also determines whether the third measurement satisfies a third threshold (1204). In examples in which switch 870 is activated during the third measurement, testing circuit 840 may be configured to determine that the parameter magnitude at switch 870 is greater than or equal to the third threshold level or that the parameter magnitude is within an acceptable range. In examples in which switch 870 is deactivated during the second measurement, testing circuit 840 may be configured to determine that the parameter magnitude at switch 870 is less than or equal to the third threshold level.

Responsive to determining that all three thresholds have been satisfied, testing circuit 840 determines that no fault has occurred on switch 870 (1206). Testing circuit 840 may be configured to output an indication of this determination to microcontroller 884. Driver device 800 may be configured to continue normal operation in response to determining that no fault has occurred on switch 870.

Responsive to determining that one or more of the three thresholds have not been satisfied, testing circuit 840 determines that a fault has occurred on switch 870 (1208). Testing circuit 840 may be configured to output an indication of this determination to microcontroller 884. In response to determining a fault, driver device 800 may be configured to isolate the fault from power supply 890 and/or from load 878.

Figure 13:
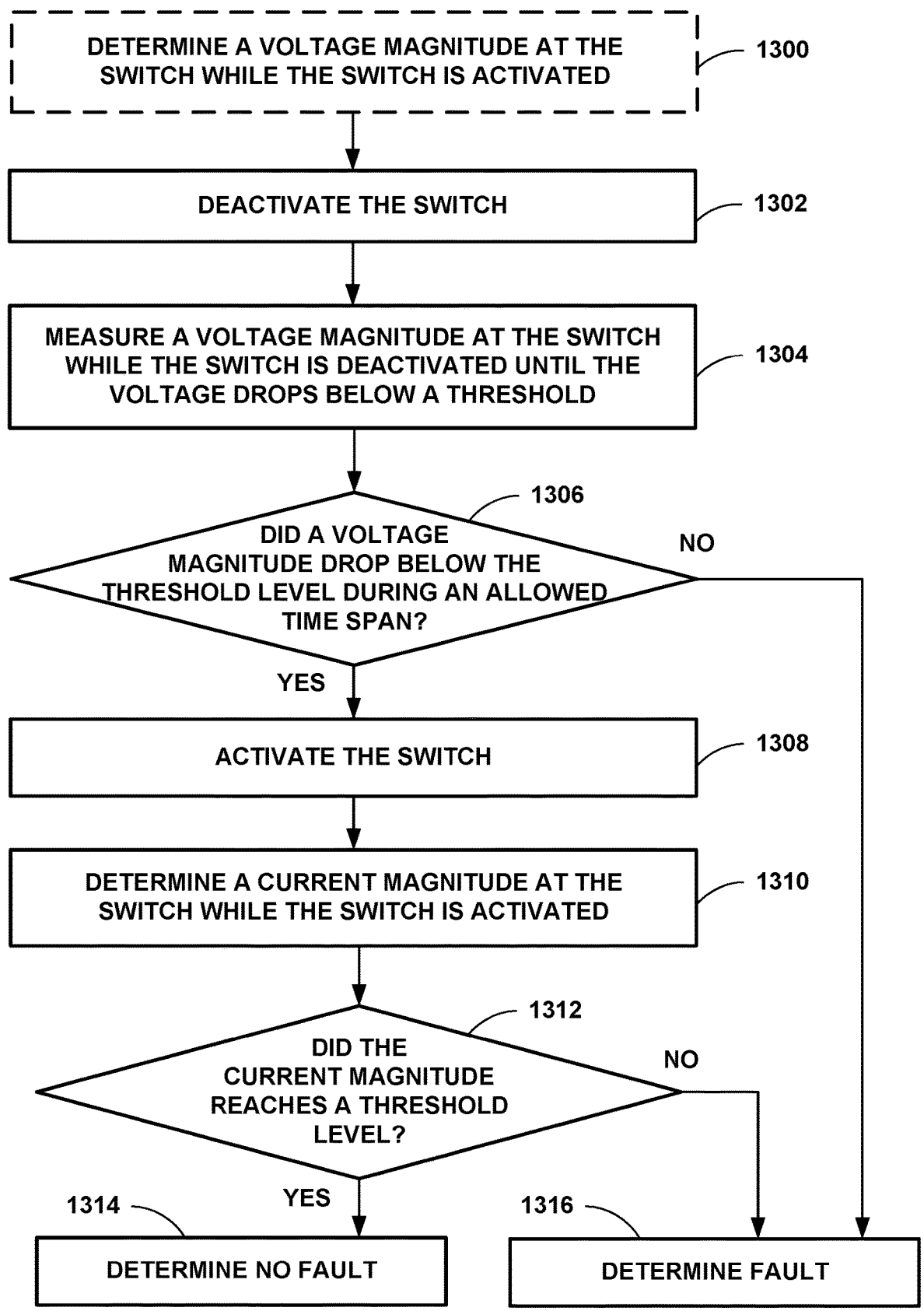
FIG. 13 is a flow diagram illustrating example techniques for testing a switch that delivers power to a capacitive load, in accordance with the techniques of this disclosure.

FIG. 13 is a flow diagram illustrating example techniques for testing a switch that delivers power to a capacitive load, in accordance with the techniques of this disclosure. The techniques of FIG. 13 are described with reference to driver device 600 shown in FIG. 6, but the techniques of FIG. 13 may be performed by any of driver devices 100, 200, 300, 400, and 800 shown in FIGS. 1-4 and 8.

In the example of FIG. 13, the testing circuit takes a first, optional measurement by determining a voltage magnitude at switch 670 while switch 670 is activated (1300). Control circuit 608 then deactivates switch 670 after the first measurement (1302). Deactivating switch 670 causes the voltage at input node 620 to slowly discharge through capacitive load 678. Driver device 600 determines a voltage magnitude at switch 670 while switch 670 is deactivated until the voltage magnitude drops below a threshold level (1304).

In response to determining that the voltage magnitude drops has not dropped below the threshold level within a maximum allowed time span (1306), driver device 600 determines that a fault has occurred (1316). In response to determining that the voltage magnitude drops has dropped below the threshold level within the maximum allowed time span, control circuit 608 reactivates switch 670 (1308). Reactivating switch 670 causes a temporary recharge current with a larger magnitude than the normal charge current for load 678. In some examples, the recharge current is orders of magnitude higher than the normal charge current.

Driver device then determines a magnitude of a current at switch 670 while switch 670 is activated (1310) and determines whether the current magnitude is greater than a second threshold level (1312). In response to determining that at least one measurement of the current magnitude is greater than the second threshold level, driver device 600 determines that no fault has occurred (1314). In response to determining that none of the measurements of the current magnitude are greater than the second threshold level, driver device 600 determines that a fault has occurred (1316).

The following numbered clauses demonstrate one or more aspects of the disclosure.

Clause 1. A method includes delivering driving signals to a switch, toggling the switch at a first instance, and determining a parameter magnitude at the switch at a second instance after toggling the switch at the first instance by at least determining a voltage magnitude at the switch at the second instance. The method also includes toggling the switch after the second instance and determining a parameter magnitude at the switch at a third instance after toggling the switch after the second instance. The method further includes generating an output based on the determined parameter magnitudes at the switch at the second and third instances.

Clause 2. The method of clause 1, further including autonomously performing a status check.

Clause 3. The method of the preceding clauses or any combination thereof, further including autonomously causing the control circuit to toggle the switch at the first instance.

Clause 4. The method of the preceding clauses or any combination thereof, further including autonomously determining the parameter magnitude at the switch at the second instance.

Clause 5. The method of the preceding clauses or any combination thereof, further including autonomously causing the control circuit to toggle the switch after the second instance.

Clause 6. The method of the preceding clauses or any combination thereof, further including autonomously determining the parameter magnitude at the switch at the third instance.

Clause 7. The method of the preceding clauses or any combination thereof, further including autonomously generating the output.

Clause 8. The method of the preceding clauses or any combination thereof, further including initiating the status check based on a schedule stored to the memory.

Clause 9. The method of the preceding clauses or any combination thereof, further including transmitting data indicating the determined parameter magnitudes at the switch at the second and third instances to a microcontroller.

Clause 10. The method of the preceding clauses or any combination thereof, further including receiving a command from a microcontroller.

Clause 11. The method of the preceding clauses or any combination thereof, further including performing a status check for the switch in response to receiving the command.

Clause 12. The method of the preceding clauses or any combination thereof, further including causing the control circuit to toggle the switch at the first instance in response to receiving the command from the microcontroller.

Clause 13. The method of the preceding clauses or any combination thereof, further including determining the parameter magnitude at the switch at the second instance in response to receiving the command from the microcontroller.

Clause 14. The method of the preceding clauses or any combination thereof, further including determining a parameter magnitude at the switch before toggling the switch before the first instance.

Clause 15. The method of the preceding clauses or any combination thereof, further including generating the output based on the determined parameter magnitudes at the switch before the first instance and at the second and third instances.

Clause 16. The method of the preceding clauses or any combination thereof, further including determining whether the voltage magnitude at the switch at the second instance is not less than a threshold level within a maximum allowed time span.

Clause 17. The method of the preceding clauses or any combination thereof, further including determining that a fault has occurred on the switch or on a load in response to determining that the voltage magnitude at the switch at the second instance is not less than the threshold level within the maximum allowed time span.

Clause 18. The method of the preceding clauses or any combination thereof, further including causing the control circuit to toggle the switch after the second instance in response to determining that voltage magnitude at the switch at the second instance is less than the threshold level within the maximum allowed time span.

Clause 19. The method of the preceding clauses or any combination thereof, further including determining a current magnitude at the switch at the third instance in response to determining that voltage magnitude at the switch at the second instance is less than the threshold level within the maximum allowed time span.

Clause 20. The method of the preceding clauses or any combination thereof, further including determining whether a current magnitude through the switch at the third instance is not greater than a threshold level.

Clause 21. The method of the preceding clauses or any combination thereof, further including determining that a fault has occurred on the switch or on a load in response to determining that the current magnitude at the switch at the third instance is not greater than the threshold level.

Clause 22. The method of the preceding clauses or any combination thereof, further including determining the voltage magnitude at the switch based on the sensed signal received at the input node.

Clause 23. The method of the preceding clauses or any combination thereof, further including activating the current source before the second instance.

Clause 24. The method of the preceding clauses or any combination thereof, further including deactivating the current source after the second instance and before the third instance.

Clause 25. The method of the preceding clauses or any combination thereof, further including deactivating the (first) switch and deactivating a second switch at the first instance, where the second switch is connected in series with the first switch.

Clause 26. The method of the preceding clauses or any combination thereof, further including converting a first signal to a digital number, where the first signal indicates a voltage magnitude at the switch.

Clause 27. The method of the preceding clauses or any combination thereof, further including converting a second signal to a digital number, where the second signal indicates a current magnitude at the switch.

Clause 28. The method of the preceding clauses or any combination thereof, where determining that a fault has occurred on the switch includes determining that a difference between a voltage magnitude at the switch before the first instance and a voltage magnitude at the switch at the third instance does not satisfy a first threshold.

Clause 29. The method of the preceding clauses or any combination thereof, where determining that a fault has occurred on the switch includes determining that the voltage magnitude at the switch at the second instance does not satisfy a second threshold.

Clause 30. The method of the preceding clauses or any combination thereof, where determining that a fault has occurred on the switch includes determining that the voltage magnitude at the switch at the third instance does not satisfy a third threshold.

Clause 31. The method of the preceding clauses or any combination thereof, further including causing the control circuit to toggle a second switch at a fourth instance.

Clause 32. The method of the preceding clauses or any combination thereof, further including determining a parameter magnitude at a second switch at a fifth instance after toggling the second switch after the fourth instance by at least determining a voltage magnitude at the second switch at the fifth instance.

Clause 33. The method of the preceding clauses or any combination thereof, further including causing the control circuit to toggle a second switch after the fifth instance.

Clause 34. The method of the preceding clauses or any combination thereof, further including determining a parameter magnitude at a second switch at a sixth instance after toggling the second switch after the fifth instance.

Clause 35. The method of the preceding clauses or any combination thereof, further including generating a second output based on the determined parameter magnitudes at a second switch at the fifth and sixth instances.

Clause 36. The method of the preceding clauses or any combination thereof, where the third instance is less than one hundred microseconds after the first instance.

Clause 37. A device including a control circuit configured to deliver driving signals to a switch. The device also includes a testing circuit configured to perform the method of preceding clauses or any combination thereof.

Clause 38. A device includes a control circuit configured to deliver driving signals to a switch. The device also includes a testing circuit configured to cause the control circuit to toggle the switch at a first instance and determine a parameter magnitude at the switch at a second instance after toggling the switch at the first instance by at least determining a voltage magnitude at the switch at the second instance. The testing circuit is also configured to cause the control circuit to toggle the switch after the second instance and determine a parameter magnitude at the switch at a third instance after toggling the switch after the second instance. The testing circuit is further configured to generate an output based on the determined parameter magnitudes at the switch at the second and third instances.

Clause 39. The device of clause 37 or clause 38, where the testing circuit is configured to perform the method of examples 1-36 or any combination thereof.

Clause 40. The device of clauses 37-39 or any combination thereof, further including a memory configured to store a schedule for a status check.

Clause 41. The device of clauses 37-40 or any combination thereof, further including a memory configured to store measurement values of the determined parameter magnitudes.

Clause 42. The device of clauses 37-41 or any combination thereof, further including an input node configured to receive a sensed signal from a channel terminal of the switch.

Clause 43. The device of clauses 37-42 or any combination thereof, further including a current source configured to generate a current across the input node.

Clause 44. The device of clauses 37-43 or any combination thereof, further including an ADC configured to receive a first signal indicating a voltage magnitude at the switch.

Clause 45. The device of clauses 37-44 or any combination thereof, further including an ADC configured to receive a second signal indicating a current magnitude at the switch.

Clause 46. The device of clauses 37-45 or any combination thereof, further including a first input node configured to receive a first signal from a first channel terminal of the switch.

Clause 47. The device of clauses 37-46 or any combination thereof, further including a second input node configured to receive a second signal from a second channel terminal of the switch.

Clause 48. The device of clauses 37-47 or any combination thereof, further including a first current source configured to generate a first current across a first input node.

Clause 49. The device of clauses 37-48 or any combination thereof, further including a second current source configured to generate a second current across a second input node.

Clause 50. The device of clauses 37-49 or any combination thereof, where the control circuit is configured to deliver a second set of driving signals to a second switch.

Clause 51. The device of clauses 37-50 or any combination thereof, where the third instance is less than one hundred microseconds after the first instance.

Clause 52. A system includes a switch configured to deliver power from a power source to a load, a microcontroller configured to generate control signals for the switch, and a driver device configured to generate driving signals based on the control signals received from the microcontroller and deliver driving signals to the switch. The device includes a testing circuit configured to perform the method of examples 1-36 or any combination thereof. The microcontroller is further configured to determine whether a fault has occurred in the system based on the parameter magnitudes at the switch at the second and third instances.

Clause 53. A system includes a switch configured to deliver power from a power source to a load, a microcontroller configured to generate control signals for the switch, and a driver device configured to generate driving signals based on the control signals received from the microcontroller and deliver driving signals to the switch. The device includes a testing circuit configured to toggle the switch at a first instance, determine a parameter magnitude at the switch at a second instance after toggling the switch at the first instance by at least determining a voltage magnitude at the switch at the second instance, and toggle the switch after the second instance. The testing circuit is also configured to determine a parameter magnitude at the switch at a third instance after toggling the switch after the second instance and transmit, to the microcontroller, data indicating the parameter magnitudes at the switch at the second and third instances. The microcontroller is configured to determine whether a fault has occurred in the system based on the parameter magnitudes at the switch at the second and third instances.

Clause 54. A device includes a computer-readable medium having executable instructions stored thereon, configured to be executable by processing circuitry for causing the processing circuitry to perform the method of examples 1-36 or any combination thereof.

Clause 55. A system includes means for performing the method of examples 1-36 or any combination thereof.

Various examples of the disclosure have been described. Any combination of the described systems, operations, or functions is contemplated. These and other examples are within the scope of the following claims.

What is claimed is:

1. A device comprising:
   a control circuit configured to deliver driving signals to a switch; and
   a testing circuit configured to:
      cause the control circuit to toggle the switch at a first instance;
      determine a parameter magnitude at the switch at a second instance after toggling the switch at the first instance by at least determining a voltage magnitude at the switch at the second instance;
      cause the control circuit to toggle the switch after the second instance;
      determine a parameter magnitude at the switch at a third instance after toggling the switch after the second instance; and
      generate an output based on the determined parameter magnitudes at the switch at the second and third instances.

2. The device of claim 1, wherein the testing circuit is configured to autonomously perform a status check, and wherein to perform the status check, the testing circuit is configured to:
   autonomously cause the control circuit to toggle the switch at the first instance;
   autonomously determine the parameter magnitude at the switch at the second instance;
   autonomously cause the control circuit to toggle the switch after the second instance;
   autonomously determine the parameter magnitude at the switch at the third instance; and
   autonomously generate the output.

3. The device of claim 2, further comprising a memory, wherein the testing circuit is configured to initiate the status check based on a schedule stored to the memory.

4. The device of claim 1, wherein to generate the output, the testing circuit is configured to transmit data indicating the determined parameter magnitudes at the switch at the second and third instances to a microcontroller.

5. The device of claim 1, wherein the testing circuit is configured to:
   receive a command from a microcontroller; and
   perform a status check for the switch in response to receiving the command, wherein performing the status check comprises:

causing the control circuit to toggle the switch at the first instance in response to receiving the command from the microcontroller; and determining the parameter magnitude at the switch at the second instance in response to receiving the command from the microcontroller.

6. The device of claim 1,
wherein the testing circuit is configured to determine a parameter magnitude at the switch before toggling the switch before the first instance, and
wherein the testing circuit is configured to generate the output based on the determined parameter magnitudes at the switch before the first instance and at the second and third instances.

7. The device of claim 1, wherein the testing circuit is configured to:
determine whether the voltage magnitude at the switch at the second instance is not less than a threshold level within a maximum allowed time span; and
determine that a fault has occurred on the switch or on a load in response to determining that the voltage magnitude at the switch at the second instance is not less than the threshold level within the maximum allowed time span.

8. The device of claim 7, wherein the testing circuit is configured to:
cause the control circuit to toggle the switch after the second instance in response to determining that voltage magnitude at the switch at the second instance is less than the threshold level within the maximum allowed time span; and
determine the parameter magnitude at the switch at the third instance by at least determining a current magnitude at the switch at the third instance in response to determining that voltage magnitude at the switch at the second instance is less than the threshold level within the maximum allowed time span.

9. The device of claim 1, wherein the testing circuit is configured to:
determine whether a current magnitude through the switch at the third instance is not greater than a threshold level; and
determine that a fault has occurred on the switch or on a load in response to determining that the current magnitude at the switch at the third instance is not greater than the threshold level.

10. The device of claim 1, further comprising:
an input node configured to receive a sensed signal from a channel terminal of the switch; and
a current source configured to generate a current across the input node,
wherein the testing circuit is configured to:
determine the voltage magnitude at the switch based on the sensed signal received at the input node;
activate the current source before the second instance; and
deactivate the current source after the second instance and before the third instance.

11. The device of claim 10,
wherein the switch is a first switch,
wherein the testing circuit is configured to cause the control circuit to toggle the first switch at the first instance by at least deactivating the first switch, and
wherein the testing circuit is configured to deactivate a second switch connected in series with first switch at the first instance and before the second instance.

12. The device of claim 1, further comprising one or more analog-to-digital converters (ADCs) configured to receive a first signal and a second signal,
wherein the first signal indicates a voltage magnitude at the switch, and
wherein the second signal indicates a current magnitude at the switch.

13. The device of claim 12, further comprising:
a first input node configured to receive the first signal from a first channel terminal of the switch;
a second input node configured to receive the second signal from a second channel terminal of the switch;
a first current source configured to generate a first current across the first input node; and
a second current source configured to generate a second current across the second input node.

14. The device of claim 1, wherein to determine that a fault has occurred on the switch, the testing circuit is configured to:
determine that a difference between a voltage magnitude at the switch before the first instance and a voltage magnitude at the switch at the third instance does not satisfy a first threshold;
determine that the voltage magnitude at the switch at the second instance does not satisfy a second threshold; or
determine that the voltage magnitude at the switch at the third instance does not satisfy a third threshold.

15. The device of claim 1,
wherein the switch is a first switch,
wherein the driving signals are a first set of driving signals,
wherein the output is a first output,
wherein the control circuit is configured to deliver a second set of driving signals to a second switch, and
wherein the testing circuit is configured to:
cause the control circuit to toggle the second switch at a fourth instance;
determine a parameter magnitude at the second switch at a fifth instance after toggling the second switch after the fourth instance by at least determining a voltage magnitude at the second switch at the fifth instance;
cause the control circuit to toggle the second switch after the fifth instance;
determine a parameter magnitude at the second switch at a sixth instance after toggling the second switch after the fifth instance; and
generate a second output based on the determined parameter magnitudes at the second switch at the fifth and sixth instances.

16. The device of claim 15, further comprising one or more analog-to-digital converters (ADCs) configured to receive a first signal and a second signal,
wherein the first signal indicates the voltage magnitude at the first switch, and
wherein the second signal indicates the voltage magnitude at the second switch.

17. The device of claim 1, wherein the third instance is less than one hundred microseconds after the first instance.

18. A method comprising:
delivering driving signals to a switch;
toggling the switch at a first instance;
determining a parameter magnitude at the switch at a second instance after toggling the switch at the first instance by at least determining a voltage magnitude at the switch at the second instance;
toggling the switch after the second instance;

determining a parameter magnitude at the switch at a third instance after toggling the switch after the second instance; and generating an output based on the determined parameter magnitudes at the switch at the second and third instances.

19. A system comprising:

a switch configured to deliver power from a power source to a load;

a microcontroller configured to generate control signals for the switch; and a driver device configured to:
  generate driving signals based on the control signals received from the microcontroller; and
  deliver driving signals to the switch,
wherein the driver device comprises a testing circuit configured to:
  toggle the switch at a first instance;
  determine a parameter magnitude at the switch at a second instance after toggling the switch at the first instance by at least determining a voltage magnitude at the switch at the second instance;
  toggle the switch after the second instance;
  determine a parameter magnitude at the switch at a third instance after toggling the switch after the second instance; and
  transmit, to the microcontroller, data indicating the parameter magnitudes at the switch at the second and third instances,
wherein the microcontroller is configured to determine whether a fault has occurred in the system based on the parameter magnitudes at the switch at the second and third instances.

20. The system of claim 19,
wherein the microcontroller is configured to transmit a command to the driver device, and
wherein the driver device is configured to perform a status check for the switch in response to receiving the command, wherein performing the status check comprises:
  causing the control circuit to toggle the switch at the first instance in response to receiving the command from the microcontroller; and
  determining a parameter magnitude at the switch at the second instance in response to receiving the command from the microcontroller.

21. The system of claim 19, wherein the driver device comprises a memory configured to store a schedule, and wherein the driver device is configured to:
  toggle the switch at the first instance autonomously based on the schedule stored to the memory; and
  determine the voltage magnitude at the switch at the second instance autonomously based on the schedule stored to the memory.

22. The system of claim 19,
wherein the driver device comprises one or more analog-to-digital converters (ADCs) configured to receive a first signal and a second signal,
wherein the first signal indicates a voltage magnitude at the switch, and
wherein the second signal indicates a current magnitude at the switch.

23. The system of claim 19, wherein the testing circuit is configured to:
  determine a parameter magnitude at the switch before toggling the switch at the first instance; and
  transmit, to the microcontroller, data indicating the parameter magnitude at the switch at the first instance,
wherein the microcontroller is configured to determine whether the fault has occurred based on the parameter magnitudes at the switch at the first, second, third instances.

* * * * *